United States Patent
Voutilainen et al.

(10) Patent No.: US 8,406,037 B2
(45) Date of Patent: Mar. 26, 2013

(54) APPARATUS AND A METHOD

(75) Inventors: Martti Kalevi Voutilainen, Espoo (FI); Pirjo M. Pasanen, Helsinki (FI)

(73) Assignee: Nokia Corporation, Espoo (FI)

( * ) Notice: Subject to any disclaimer, the term of this patent is extended or adjusted under 35 U.S.C. 154(b) by 291 days.

(21) Appl. No.: 12/984,881

(22) Filed: Jan. 5, 2011

(65) Prior Publication Data

US 2012/0170354 A1 Jul. 5, 2012

(51) Int. Cl.
*G11C 11/34* (2006.01)

(52) U.S. Cl. .................... 365/149; 365/185.05

(58) Field of Classification Search .............. 365/149, 365/185.05
See application file for complete search history.

(56) References Cited

U.S. PATENT DOCUMENTS

| | | | |
|---|---|---|---|
| 7,012,362 B2 * | 3/2006 | Kawate et al. | 313/495 |
| 7,764,534 B2 * | 7/2010 | Thorp et al. | 365/148 |
| 2010/0084697 A1 | 4/2010 | Kopp et al. | 257/396 |

FOREIGN PATENT DOCUMENTS

| WO | WO 2009/126489 A1 | 10/2009 |
|---|---|---|
| WO | WO 2010/036210 A1 | 4/2010 |

OTHER PUBLICATIONS

Dielectric thickness dependence of capacitive behaviour in grapheme deposited on silicon dioxide, Sonde S; Giannazzo F; Raineri V; Rimini E, J. Vac. Technol. B; vol. 27, No. 2, pp. 868-873, Mar. 30, 2009.

Radio-Frequency Electrical Characteristics of Single Layer Graphene, Dae-Young Jeon et al. Journal of Applied Physics 48 (2009) p. 091061-1, 3.

"Nonvolatile Switching in Graphene Field-Effect Devices", IEEE Elctron Device Letters, vol. 29, No. 8, Aug. 2008, (pp. 952-954).

Ponomarenko et al, "Density of states and zero Landau level probed through capacitance of grapheme", (pp. 1-3), Sep. 2010, Physics Review Letters (105, 136801).

* cited by examiner

*Primary Examiner* — Son Dinh
(74) *Attorney, Agent, or Firm* — Harrington & Smith

(57) ABSTRACT

An apparatus including a first electrode; a second electrode including graphene; and a dielectric between the first electrode and the second electrode; input circuitry configured to change a charge state of the dielectric by causing electric charges to be trapped in the dielectric; and output circuitry configured to detect a value dependent upon a quantum capacitance of the graphene of the second electrode, wherein the quantum capacitance of the graphene is dependent upon the charge state of the dielectric.

20 Claims, 4 Drawing Sheets

APPARATUS AND A METHOD

TECHNOLOGICAL FIELD

Embodiments of the present invention relate to an apparatus and a method. In particular, they relate to an apparatus that may be used for data storage and a method of data storage.

BACKGROUND

Memories for electronic devices may change an electrostatic state of a memory cell to record a bit of information.

Some memories are non-volatile and some memories are volatile.

An example of a volatile memory is dynamic random access memory (DRAM). In DRAM a memory cell comprises a capacitor which is kept charged to record a bit of information. A DRAM memory cell may need to be refreshed every 64 ms or less.

An example of a non-volatile memory is a floating gate metal oxide semiconductor (FGMOS) field effect transistor (FET). The floating gate is capable of retaining charge after tunnel injection of charge to the floating gate.

BRIEF SUMMARY

According to various, but not necessarily all, embodiments of the invention there is provided an apparatus comprising: a first electrode; a second electrode comprising graphene; and a dielectric between the first electrode and the second electrode; input circuitry configured to change a charge state of the dielectric by causing electric charges to be trapped in the dielectric; and output circuitry configured to detect a value dependent upon a quantum capacitance of the graphene of the second electrode, wherein the quantum capacitance of the graphene is dependent upon the charge state of the dielectric.

According to various, but not necessarily all, embodiments of the invention there is provided a method comprising: trapping electric charges in a dielectric adjacent a graphene electrode; and detecting a value dependent upon a quantum capacitance of the graphene electrode.

According to various, but not necessarily all, embodiments of the invention there is provided an apparatus comprising: a first electrode; a second electrode comprising graphene; and a polarizable material adjacent the second electrode; input circuitry configured to change a polarization state of the polarizable material; and output circuitry configured to detect a value dependent upon a quantum capacitance of the graphene of the second electrode, wherein the quantum capacitance of the graphene is dependent upon the polarization state of the polarizable material.

A method comprising: controlling a polarization state of a polarizable material adjacent a graphene electrode; and detecting a value dependent upon a quantum capacitance of the graphene electrode.

BRIEF DESCRIPTION

For a better understanding of various examples of embodiments of the present invention reference will now be made by way of example only to the accompanying drawings in which.

DETAILED DESCRIPTION

Figure 1:
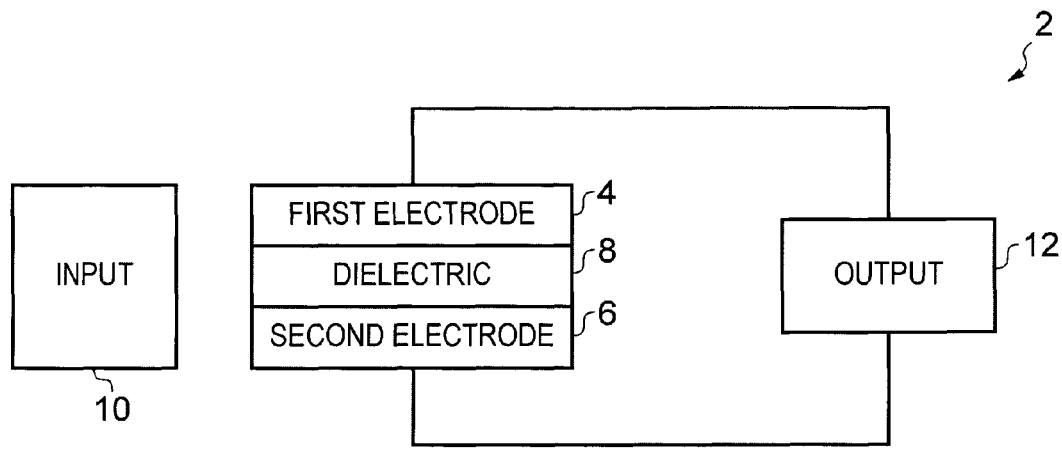
FIG. 1 illustrates an example of an apparatus comprising: a first electrode; a second electrode comprising graphene; a dielectric between the first electrode and the second electrode; input circuitry configured to change a charge state of the dielectric and output circuitry configured to detect a quantum capacitance of the graphene of the second electrode.

FIG. 1 illustrates an apparatus 2 comprising: a first electrode 4; a second electrode 6 comprising graphene; and a dielectric 8 between the first electrode 4 and the second electrode 6; input circuitry 10 configured to change a charge state of the dielectric 8 by causing electric charges to be trapped in the dielectric 8; and output circuitry 12 configured to detect a value dependent upon a quantum capacitance of the graphene of the second electrode 8, wherein the quantum capacitance of the graphene is dependent upon the charge state of the dielectric 8.

Figure 9:
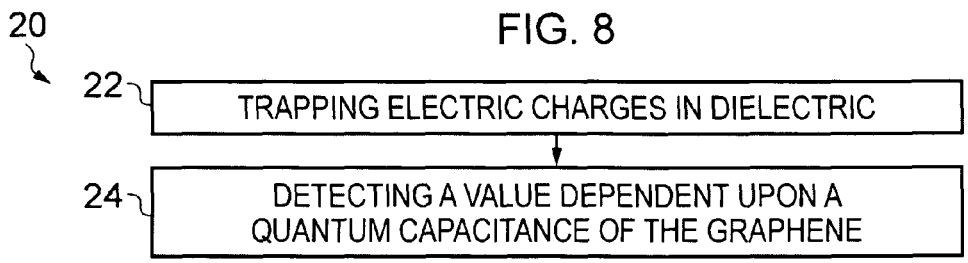
FIG. 9 illustrates a method.

As illustrated in the method 20 shown in FIG. 9, first at block 22 electric charges are trapped in the dielectric 8 adjacent the graphene of the second electrode 6. Then at block 24, a value dependent upon a quantum capacitance of the graphene of the second electrode 6 is detected.

The output circuitry 12 is configured to measure capacitance, not resistance. This may, for example, be achieved by measuring a response of a circuit or by measuring a resonant frequency of a resonant circuit.

Graphene has the advantage over carbon nanotubes (CNTs) that the component fabrication is possible using similar processing methods as is used for CMOS circuits, such as lithography.

Figure 2:
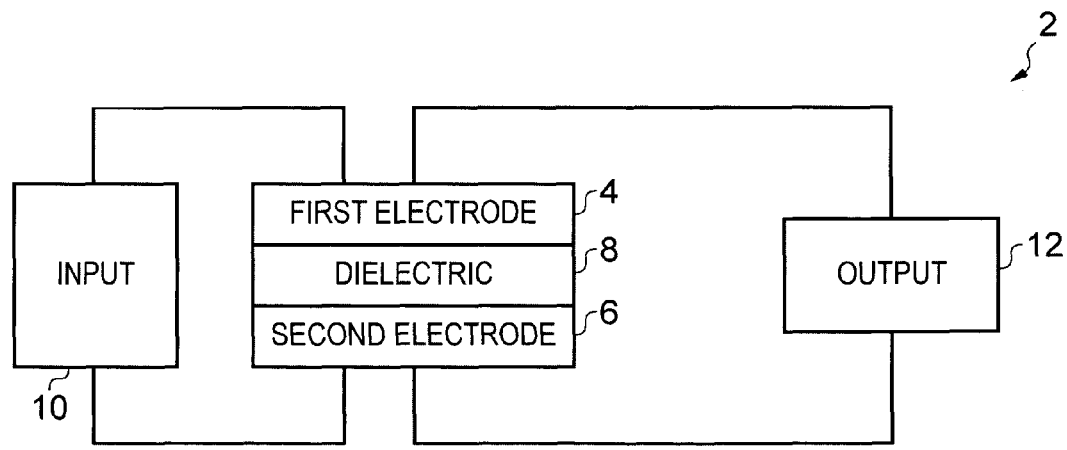
FIG. 2 illustrates an example of an apparatus that is similar to that illustrated in FIG. 1, however, in this example the input circuitry is configured to change a charge state of the dielectric by applying one or more high voltage pulses to the first electrode.

The graphene may be a two-dimensional (2D) monolayer. CNT are a graphene monolayer rolled into a cylinder. The physics of two-dimensional (2D) graphene is different from the "1D" CNTs, for which some quantities are quantized due to the periodicity in the rolled-up dimension. Also, the edges of graphene cause the physics (electrical properties) to be different. Monolayer graphene is a semimetal (semiconductor with zero band gap) in it's pristine state without any treatments FIG. 2 illustrates an apparatus 2 that is similar to that illustrated in FIG. 1, however, in this example the input circuitry 10 is configured to change a charge state of the dielectric 8 by applying one or more high voltage pulses to the first electrode 4 while the second electrode is held at ground (biased to zero volts).

The input circuitry 10 is configured to reversibly trap charges in the dielectric 8 to change its charge state. The dielectric 8 facilitates a fast change in charge state. It is selected to enable fast trapping of charges in response to an application of a first potential and to enable fast un-trapping of charges in response to an application of a second potential of opposite polarity to the first potential. The input circuitry 10 enables fast creation and erasing of charge traps without changing the graphene chemically. A charge state of the dielectric 8 may be changed, in some example, in less than 200 ns and in some examples less than 100 ns.

The input circuitry 10 is configured to write a bit by applying one or more high voltage pulses of a first polarity to the first electrode 4 and is configured to erase a bit by applying one or more high voltage pulses of a second polarity, opposite to the first polarity, to the first electrode 4.

Quantum capacitance (electronic compressibility) $C_q$ of graphene may be defined as:

$$C_q = e^2 D$$

where $D(E) = dn/dE$ at the Fermi energy $E_F$, e is electron charge and n is the carrier concentration in the graphene. D is a strong function of the Fermi energy $E_F$ The trapping of electric charges in the dielectric 8 creates an electrostatic potential that modifies the Fermi energy of the graphene in the second electrode 6. The trapping of electric charge in the dielectric 8 changes the charge state of the dielectric 8.

Figure 3:
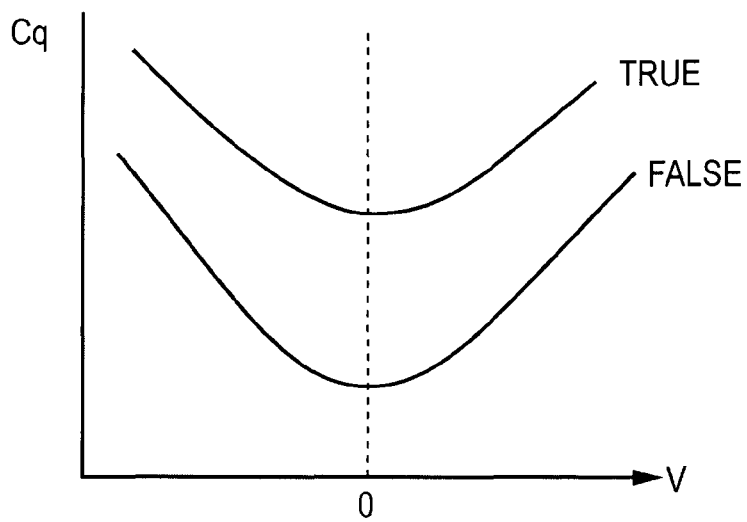
FIG. 3 illustrates for the graphene, an example of a first quantum capacitance state (TRUE) associated with a first charge state of the dielectric and an example of a second quantum capacitance state (FALSE) associated with a second charge state of the dielectric.

The dielectric 8 may have a first charge state and a second charge state. As illustrated in FIG. 3, the graphene then has a first quantum capacitance state (TRUE) associated with the first charge state of the dielectric 8 and a second quantum capacitance state (FALSE) associated with the second charge state of the dielectric 8.

The charge states of the dielectric may be non volatile. The associated quantum capacitance state of the graphene of the second electrode 6 is then also non-volatile.

The quantum capacitance of the graphene of the second electrode 6 may dominate electrostatics of the apparatus 2 if the size of thee first ad second electrodes is sufficiently small.

The capacitance of the first quantum capacitance state (TRUE) is in the illustrated example at least three times the capacitance of the second quantum capacitance state (FALSE) at the charge neutrality (Dirac) point. This enables differentiation between the quantum capacitance states at the or near the Dirac point.

The capacitance of the second quantum capacitance state (FALSE) may be less than 1 fF.

In this illustrated example, the capacitance of the second quantum capacitance state (FALSE) is approximately 0.3 fF and the capacitance of the first quantum capacitance state (TRUE) is approximately 1 fF.

Figure 5:
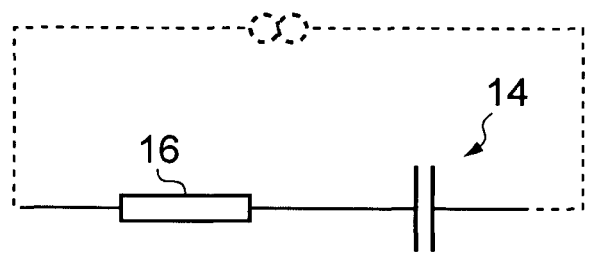
FIG. 5 illustrates a series resistance-capacitance (RC) circuit comprising the capacitor in series with the resistance.

As illustrated in FIG. 5 the first electrode 4, the second electrode 6 comprising graphene; and the dielectric 8 between the first electrode 4 and the second electrode 6 form a capacitor 14 within a circuit 18. The circuit 18 is a series resistance-capacitance (RC) circuit 18. The RC circuit 18 comprises the capacitor 14 in series with a resistance 16. The product of the resistance R of the resistance 16 and the capacitance C of the capacitor 14 determines the read speed for the apparatus 2. It may, for example, be less than 10 ps.

The output circuitry 12 may be configured to disturb the capacitor 14 from electrostatic equilibrium and to measure a response to said disturbance.

Figure 4:
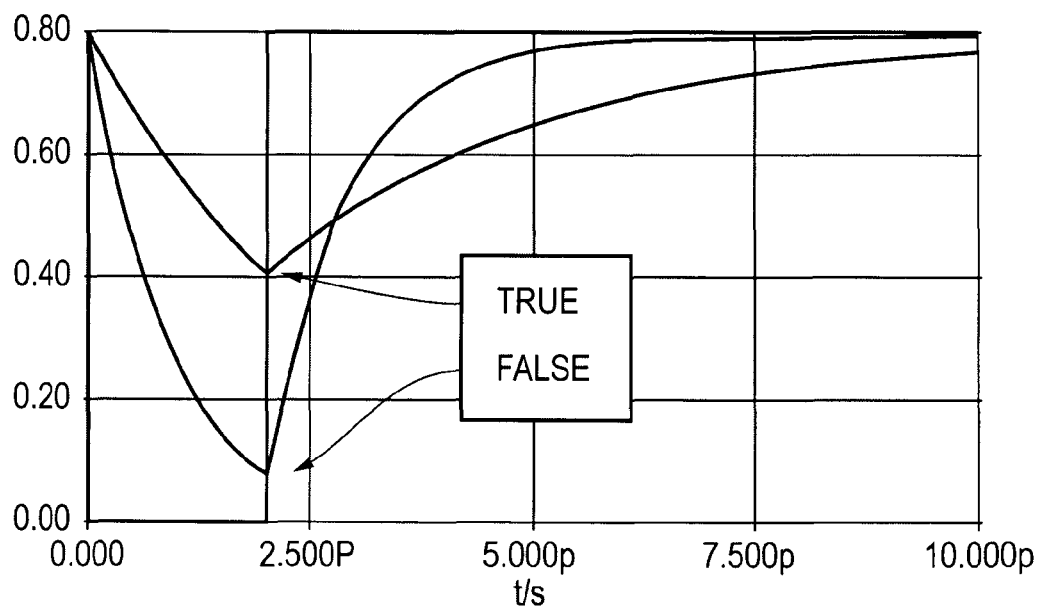
FIG. 4 illustrates an example of a response of a capacitor comprising the first electrode, the second electrode comprising graphene, and the dielectric between the first electrode and the second electrode, when the capacitor is disturbed from electrostatic equilibrium by discharging the capacitor through a resistance.

In another implementation, the first electrode 4, the second electrode 6 comprising graphene; and the dielectric 8 between the first electrode 4 and the second electrode 6 form a capacitor 14 within a resonant resistance-inductance-capacitance (RLC) circuit. The capacitance C of the capacitor 14 determines the read speed for the apparatus 2. The change in the capacitance can be determined by measuring a change in resonance frequency As illustrated in FIG. 4, the output circuitry may be configured to disturb the capacitor 14 from electrostatic equilibrium by discharging the capacitor 14 through the resistance 16. In this example, the output circuitry 12 is configured to provide a falling voltage (or current) pulse and to measure a response to that pulse. In this example, the falling pulse is a voltage pulse that falls to zero volts.

While the voltage applied by the output circuitry 12 is LOW the capacitor 14 discharges. The capacitance of the capacitor 14 is dominated by the quantum capacitance of the graphene of the second electrode 6. The quantum capacitance of the graphene is determined by the charge state of the dielectric 8.

The discharge of the capacitor 14 is according to the well known expression $\exp(-t/RC)$, where RC is the time constant of exponential decay.

If the graphene is in the first quantum capacitance state (TRUE), then the RC value is larger and the decay rate is slower.

If the graphene is in the second quantum capacitance state (FALSE), then the RC value is smaller and the decay rate is faster.

When the voltage applied by the output circuitry is switched to HIGH the capacitor 14 charges.

The charging of the capacitor is according to the well known expression $1-\exp(-t/RC)$, where RC is the time constant of exponential growth.

If the graphene is in the first quantum capacitance state (TRUE), then the RC value is larger and the growth rate is slower.

If the graphene is in the second quantum capacitance state (FALSE), then the RC value is smaller and the growth rate is faster.

At the point where the voltage applied by the output circuitry 12 is switched from LOW to HIGH, the difference between the voltage at the capacitor 14 associated with the first quantum capacitance state (TRUE) and the voltage at the capacitor 14 associated with the second quantum capacitance state (FALSE) is greatest and then diminishes with time. There is therefore a window immediately following the point where the voltage applied by the output circuitry 12 is switched from LOW to HIGH, where the value of the voltage at the capacitor 14 discriminates between the first quantum capacitance state (TRUE) and the second quantum capacitance state (FALSE).

The output circuitry 12 by measuring the value of the voltage at the capacitor 14 immediately following the point where the voltage applied by the output circuitry is switched from LOW to HIGH, discriminates between the first quantum capacitance state (TRUE) and the second quantum capacitance state (FALSE).

Although FIG. 4 illustrates a binary implementation in which the output circuitry 12 discriminates between a first quantum capacitance state (TRUE) and a second quantum capacitance state (FALSE), in other implementations the output circuitry 12 may have a N-ary implementation where N>2. In such an implementation, the output circuitry discriminates between N different quantum capacitance states. However, it is necessary for the differences between the voltage at the capacitor 14 associated with adjacent quantum capacitance states are sufficient to enable discrimination.

Figure 6A:
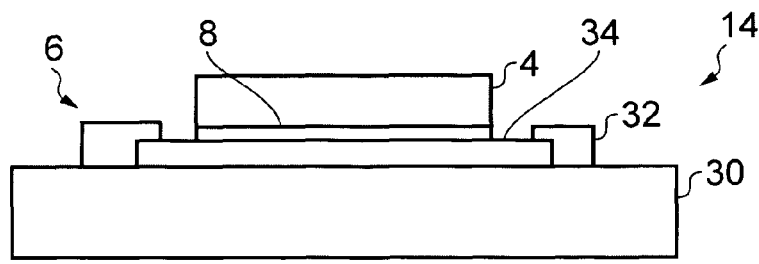
FIG. 6A illustrates a cross-sectional view of an example of the capacitor.
Figure 6B:
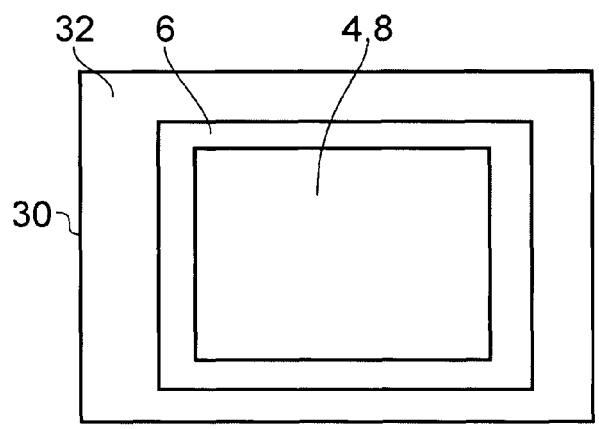
FIG. 6B illustrates a plan view of the example of the capacitor.

FIG. 6A illustrates a cross-sectional view of an example of a capacitor 14. FIG. 6B illustrates a plan view of the example of the capacitor 14.

A sheet (e.g. approximately 20 nm×20 nm) of graphene 34 may be obtained by mechanical cleavage or chemical vapor deposition and deposited on top of an oxidized silicon wafer 30. It may be reduced to size by etching. A thin dielectric layer 8 (e.g. 10 nm) may then be deposited over the graphene wafer 34. The dielectric layer may, for example, be formed in situ by depositing a material in a reactive environment e.g. aluminum in oxygen, or by atomic layer deposition. Additional chemical treatment may be used to increase the adhesion of the dielectric material to the graphene sheet. A thicker layer (e.g. 100 nm) of conductive material e.g. aluminum is then selectively deposited over at least some of the dielectric layer 8 and at a perimeter of the graphene wafer 34. The conductive material, where it overlies the dielectric 8, forms the first electrode 4. The conductive material, where it contacts the graphene wafer 34, forms part of the second electrode 6.

It is important that the conductive material of the first electrode 4 and the conductive material of the second electrode 6 do not contact. The conductive material of the second electrode 6 and the dielectric layer 8 may not contact.

The second electrode 6 therefore comprises a layer of graphene 34 and additionally comprises a galvanic contact 32 that extends around a perimeter of the graphene 34 to reduce contact resistance. The dielectric 8 is physically isolated from the galvanic contact 6.

The dielectric layer 8 may be formed from silicon dioxide, silicon nitride, aluminum oxide, or hafnium dioxide.

Figure 6C:
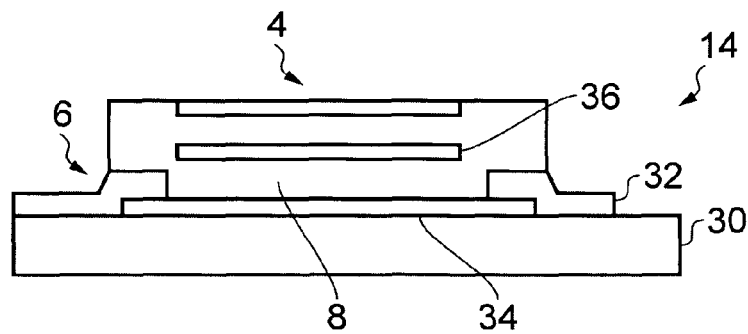
FIG. 6C illustrates a cross-sectional view of an example of a capacitor with a floating gate.

FIG. 6C illustrates a cross-sectional view of another example of a capacitor 14. This capacitor 14 is similar to the capacitor described above with reference to FIGS. 6A and 6B. However, this capacitor additionally comprises a floating electrode 36 which is situated between the first electrode 4 and the second electrode 6 within the dielectric 8. Dielectric 8 separates the first electrode 4 and the floating electrode 36. Dielectric 8 separates the second electrode 6 and the floating electrode 36. The floating electrode increases charge trapping.

Figure 7:
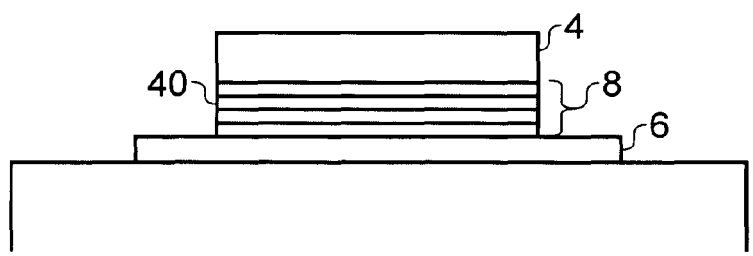
FIG. 7 illustrates a cross-sectional view of an example of a capacitor similar to that illustrated in FIG. 6A, however, in this example, the dielectric is formed as a multi-layer dielectric.

FIG. 7 illustrates a cross-sectional view of an example of a capacitor 14 similar to that illustrated in FIG. 6A, however, in this example, the dielectric 8 is formed as a multi-layer dielectric comprising a stack of distinct layers 40 of dielectrics.

The distinct layers 40 may be formed from the same or different dielectric materials and may have similar or different thicknesses.

The dielectric 8 may, for example, comprise one or more of: silicon dioxide, silicon nitride, aluminum oxide, hafnium dioxide. The distinct layers of dielectric may be chosen to have substantially different dielectric constants.

Figure 8:
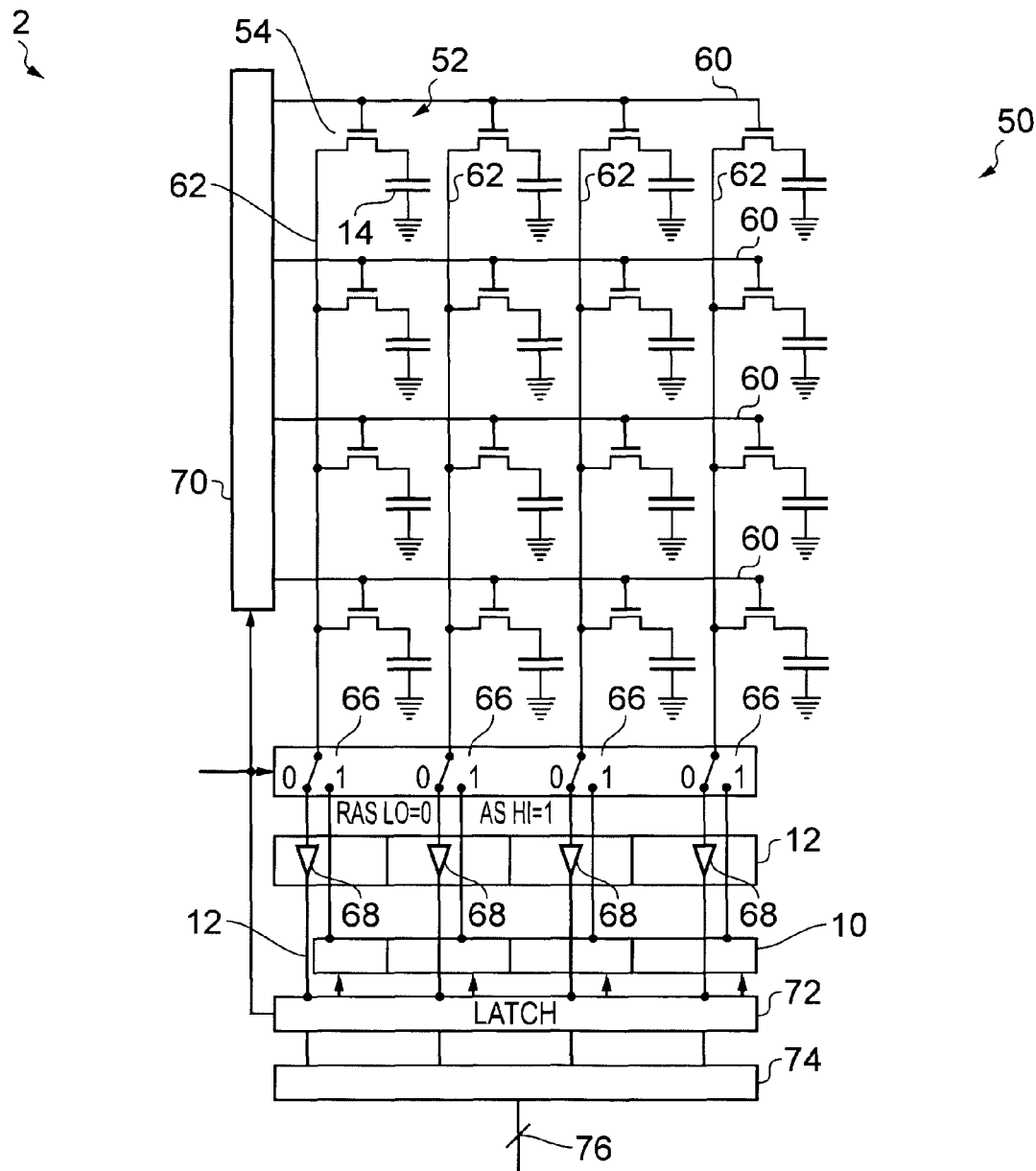
FIG. 8 illustrates an example of a memory device.

The apparatus 2 illustrated in FIG. 8 is an example of a memory device. The memory device may be a non-volatile memory device.

The memory device comprises a plurality of memory cells 52 arranged in an array 50 of rows and columns. Each row of memory cells 52 shares a first control line 60. Each column of memory cells 52 shares a second control line 62.

Each memory cell 52 comprises a capacitor 14 and a selection transistor 54. As previously described, the capacitor 14 comprises a first electrode, a second electrode comprising graphene; and a dielectric between the first electrode and the second electrode. Each capacitor 14 has its own first electrode and its own second electrode.

The selection transistor 54 comprises a channel. The capacitor 14 is connected to the second control line 62 via the channel of the selection transistor 54 when the channel is conductive.

The selection transistor 54 comprises a gate electrode that controls the conductivity of the channel and is connected to the first control line 60. In this example, the channel is conductive when the voltage applied to the gate by the first control line 60 is HIGH.

Circuitry 10 is configured to change a charge state of the dielectric of the capacitor 14 by causing electric charges to be trapped in the dielectric. Each column of memory cells 52 has its own circuitry 10 which is shared by the memory cells in that column. Each switch 66, when in state 1, connects the circuitry 10 to a respective second control line 62.

For a write operation, a row selector 70 is used to select one of the plurality of first control lines 60 and to set its voltage state to HIGH. Simultaneously a state of the switches 66 is set to state 1. The switch 66, when in state 1, connects the circuitry 10 to each of the respective second control lines 62. While the switches 66 are set to state 1 the circuitry 10 selectively provides a high voltage of, for example about 3V, to one or more of the control lines 62. A bit is stored in each of the selected memory cells 54 addressed by the selected first control line 60 and those second control lines 62 that are at a high voltage.

For an erase operation, a row selector 70 is used to select one of the plurality of first control lines 60 and to set its voltage state to HIGH. Simultaneously a state of the switches 66 is set to state 1. The switch 66, when in state 1, connects the circuitry 10 to each of the respective second control lines 62. While the switches 66 are set to state 1 the circuitry 10 selectively provides a high negative voltage of, for example about −3V, to one or more of the control lines 62. A stored bit is erased in the selected memory cells 54 addressed by the selected first control line 60 and those second control lines 62 that are at a high negative voltage.

For a read operation, a row selector 70 is used to select one of the plurality of first control lines 60 and to set its voltage state to HIGH. Simultaneously a state of the switches 66 is set to state 1 for a short period, then later they are switched to state 0.

During a read operation, when the switches 66 are set to state 1 for a short period, the circuitry 10 provides a voltage of, for example about 1V. When the switches are set to state 0, the output reading circuitry 12 reads the selected memory cells 54.

Output reading circuitry 12 is configured to take a measurement dependent upon a quantum capacitance of the graphene of the capacitor 14 in a memory cell 52. The quantum capacitance is dependent upon the charge state of the dielectric. Each column of memory cells 52 has its own output reading circuitry 12 which is shared by the memory cells 52 in that column. The switch 66, when in state 0, connects the output reading circuit 12 to the second control line 62.

In switch state 0, the voltage on the second control lines 62 is detected as either a HIGH voltage (e.g. TRUE) or a low voltage (e.g. FALSE) using an amplifier 68. The detected voltage HIGH/LOW is then stored in latch 72. A multiplexor 74 places the HIGH/LOW voltages for each of the columns onto the bus 76. This may achieve a read rate of several GB per second.

The latch 72 may provide an input to circuitry 10.

The apparatus 2 may be a module. As used here 'module' refers to a unit or apparatus that excludes certain parts/components that would be added by an end manufacturer or a user.

The illustration of a particular order to blocks in the Figures does not necessarily imply that there is a required or preferred order for the blocks and the order and arrangement of the block may be varied. Furthermore, it may be possible for some blocks to be omitted.

Although embodiments of the present invention have been described in the preceding paragraphs with reference to various examples, it should be appreciated that modifications to the examples given can be made without departing from the scope of the invention as claimed.

For example, the dielectric 8 may comprise ferromagnetic material. The polarization of the ferromagnetic material may be controlled by sweeping a voltage applied via the first electrode. The polarization of the ferromagnetic material may result in a change in the quantum capacitance of the graphene of the second electrode.

A dielectric is an electrical insulator that can be polarized by an applied electric field. The polarization may be linear and/or non-linear. For example, a ferromagnetic dielectric may have a component of polarization that is non-linear (hysteretic).

As an example, FIG. 1 may in an alternative embodiment illustrate an apparatus 2 comprising: a first electrode 4; a second electrode 6 comprising graphene; and a polarizable material 8 adjacent the second electrode 6 and positioned between the first electrode 4 and the second electrode 6; input circuitry 10 configured to change a polarization state of the polarizable material 8; and output circuitry 12 configured to detect a value dependent upon a quantum capacitance of the graphene of the second electrode, wherein the quantum capacitance of the graphene is dependent upon the polarization state of the polarizable material 8.

In other embodiments, it may be that a dielectric 8 is between the first electrode 4 and the second electrode 6 and the polarizable material is adjacent the second electrode but not between the electrodes.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:
1. An apparatus comprising:
    a first electrode;
    a second electrode comprising graphene; and
    a dielectric between the first electrode and the second electrode;
    input circuitry configured to change a charge state of the dielectric by causing electric charges to be trapped in the dielectric; and
    output circuitry configured to detect a value dependent upon a quantum capacitance of the graphene of the second electrode, wherein the quantum capacitance of the graphene is dependent upon the charge state of the dielectric.

2. An apparatus as claimed in claim 1, wherein the charge states of the dielectric are non volatile.

3. An apparatus as claimed in claim 1, comprising:
    a plurality of memory cells, each comprising
        a first electrode;
        a second electrode comprising graphene; and
        a dielectric between the first electrode and the second electrode;
        input writing circuitry configured to change a charge state of the dielectric by causing electric charges to be trapped in the dielectric; and
        output reading circuitry configured to take a measurement dependent upon a quantum capacitance of the graphene of the second electrode that is dependent upon the charge state of the dielectric.

4. An apparatus as claimed in claim 1, wherein the apparatus is a non-volatile memory device.

5. An apparatus as claimed in claim 1, wherein the dielectric has a first charge state and a second charge state, the graphene has a first quantum capacitance state associated with the first charge state of the dielectric and the graphene has a second quantum capacitance state associated with the second charge state of the dielectric.

6. An apparatus as claimed in claim 5, wherein the capacitance of the second quantum capacitance state is less than 1 fF.

7. An apparatus as claimed in claim 1, wherein the second electrode additionally comprises a galvanic contact that extends around a perimeter of the graphene to reduce contact resistance.

8. An apparatus as claimed in claim 1, wherein the second electrode additionally comprises a galvanic contact and the dielectric is physically isolated from the galvanic contact.

9. An apparatus as claimed in claim 1, wherein the dielectric is a multilayer dielectric.

10. An apparatus as claimed in claim 1, wherein the dielectric comprises one or more of: silicon dioxide, silicon nitride, aluminum oxide, hafnium dioxide.

11. An apparatus as claimed in claim 1, wherein the input circuitry is configured to reversibly trap charges in the dielectric to change its charge state.

12. An apparatus as claimed in claim 1, wherein the input circuitry is configured to write a bit by applying one or more high voltage pulses to the first electrode.

13. An apparatus as claimed in claim 1, wherein the input circuitry is configured to write a bit by applying one or more high voltage pulses of a first polarity to the first electrode and configured to erase a written bit by applying one or more high voltage pulses of a second polarity, opposite to the first polarity, to the first electrode.

14. An apparatus as claimed in claim 1, wherein the first electrode, the second electrode comprising graphene; and the dielectric between the first electrode and the second electrode form a capacitor within a series resistance-capacitance circuit.

15. An apparatus as claimed in claim 14, wherein the output circuitry is configured to disturb the capacitor from electrostatic equilibrium and to measure a response to said disturbance.

16. An apparatus as claimed in claim 15, wherein the output circuitry is configured to disturb the capacitor from electrostatic equilibrium by discharging the capacitor through a resistance.

17. An apparatus as claimed in claim 1, wherein the output circuitry is configured to provide a voltage or current pulse and to measure a response to said pulse.

18. An apparatus as claimed in claim 3, comprising first control lines and second control lines, wherein
- the plurality of memory cells are arranged in an array of rows and columns, wherein each row of memory cells shares a first control line and wherein each column of memory cells shares a second control line, and wherein
- each cell comprises a selection transistor comprising a channel in series with the first electrode and a gate electrode,
- wherein the gate electrode is connected to one of the first control line or the second control line and the channel is connected to the other of the first control line and the second control line.

19. A method comprising:
- trapping electric charges in a dielectric adjacent a graphene electrode; and
- detecting a value dependent upon a quantum capacitance of the graphene electrode.

20. An apparatus comprising:
- a first electrode;
- a second electrode comprising graphene; and
- a polarizable material adjacent the second electrode;
- input circuitry configured to change a polarization state of the polarizable material; and
- output circuitry configured to detect a value dependent upon a quantum capacitance of the graphene of the second electrode, wherein the quantum capacitance of the graphene is dependent upon the polarization state of the polarizable material.

* * * * *